US012546005B2

(12) United States Patent
Oh et al.

(10) Patent No.: US 12,546,005 B2
(45) Date of Patent: Feb. 10, 2026

(54) APPARATUS FOR PROCESSING A SUBSTRATE

(71) Applicant: Samsung Electronics Co., Ltd., Suwon-si (KR)

(72) Inventors: Youngjoon Oh, Suwon-si (KR); Sangwook Park, Suwon-si (KR); Hyeongpyo Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 513 days.

(21) Appl. No.: 18/163,587

(22) Filed: Feb. 2, 2023

(65) Prior Publication Data

US 2024/0060183 A1 Feb. 22, 2024

(30) Foreign Application Priority Data

Aug. 22, 2022 (KR) ........................ 10-2022-0104929

(51) Int. Cl.
*C23C 16/458* (2006.01)
*C23C 16/455* (2006.01)

(52) U.S. Cl.
CPC .... *C23C 16/4585* (2013.01); *C23C 16/45544* (2013.01); *C23C 16/45565* (2013.01)

(58) Field of Classification Search
CPC ............ C23C 16/4585; C23C 16/4408; C23C 16/4412; C23C 16/45544
See application file for complete search history.

(56) References Cited

U.S. PATENT DOCUMENTS 6,231,038 B1 5/2001 Keyser et al.
6,355,968 B1 3/2002 Lehmann et al.
6,521,292 B1 * 2/2003 Yudovsky ............ C23C 16/455 118/500
7,875,824 B2 1/2011 Larson et al.
8,084,705 B2 12/2011 Larson et al.
11,195,704 B2 12/2021 Zucker et al.
2005/0196971 A1 * 9/2005 Sen .................... C23C 16/4585 438/778

(Continued)

FOREIGN PATENT DOCUMENTS

KR 10-2000-0047767 A 7/2000
KR 10-2004-0017872 A 3/2004

(Continued)

*Primary Examiner* — Joseph A Miller, Jr.
(74) *Attorney, Agent, or Firm* — Fish & Richardson P.C.

(57) ABSTRACT

An apparatus for processing a substrate including a reaction chamber, a stage, a showerhead, a first outer ring and a second outer ring may be provided. The stage may be arranged in the reaction chamber to support the substrate. The showerhead may be arranged in the reaction chamber to provide the substrate with a reaction gas. The first outer ring may be configured to surround an edge portion of an upper surface of the stage. The first outer ring may include at least one alignment groove. The second outer ring may be configured to surround the first outer ring. The second outer ring may include at least one alignment pin configured to be inserted into the alignment groove. The first outer ring and the second outer ring may define a main purge passage having a uniform width therebetween to improve exhaust efficiency of the reaction gas.

20 Claims, 8 Drawing Sheets

(56) References Cited

U.S. PATENT DOCUMENTS

| | | | | |
|---|---|---|---|---|
| 2016/0181142 | A1* | 6/2016 | Raj | H01L 21/67098 264/129 |
| 2020/0234981 | A1* | 7/2020 | Schmid | H01L 21/68785 |
| 2022/0243336 | A1* | 8/2022 | Amikura | H01L 21/68735 |

FOREIGN PATENT DOCUMENTS

| | | | |
|---|---|---|---|
| KR | 10-0479295 | B1 | 3/2005 |
| KR | 10-2005-0073990 | A | 7/2005 |
| KR | 10-1411747 | B1 | 6/2014 |
| KR | 10-1974422 | B1 | 5/2019 |
| KR | 10-2251664 | B1 | 5/2021 |
| KR | 10-2393961 | B1 | 5/2022 |

* cited by examiner

APPARATUS FOR PROCESSING A SUBSTRATE

CROSS-RELATED APPLICATION

This application claims priority under 35 USC § 119 to Korean Patent Application No. 10-2022-0104929, filed on Aug. 22, 2022 in the Korean Intellectual Property Office (KIPO), the contents of which are herein incorporated by reference in their entirety.

BACKGROUND

1. Field

Example embodiments relate to apparatuses for processing a substrate. More particularly, example embodiments relate to apparatuses for processing a substrate using an atomic layer deposition process.

2. Description of the Related Art

Generally, an atomic layer deposition (ALD) apparatus may include a reaction chamber, a stage, a showerhead, an outer ring and an independent outer ring. The stage may be arranged in the reaction chamber to support a substrate. A heater may be arranged in the stage to heat the substrate. The showerhead may be arranged in the reaction chamber over the stage to provide the substrate with a reaction gas.

The independent outer ring may be arranged at an edge portion of an upper surface of the stage. The outer ring may be configured to surround the independent outer ring. The outer ring and the independent outer ring may have a flow control function to assist an exhaust of the reactions gas injected from the showerhead. Further, the outer ring may have a function for mitigating or preventing a layer from being formed on a lower surface of the stage together with a purge gas provided to the lower surface of the stage. The purge gas may flow through a purge passage between the outer ring and the independent outer ring.

According to related arts, the independent outer ring may not be fixed. Thus, a width of the purge passage (e.g., a gap between the independent outer ring and the outer ring) may not be uniform. The non-uniform width of the purge passage may cause a difference of a supplying amount of the purge gas to decrease exhaust efficiency of the reaction gas.

Particularly, because a sufficient amount of the purge gas may not flow through the narrow purge passage, a part of the purge gas may infiltrate into a central portion of the stage through a gap between the independent outer ring and the stage. As a result, particles in the part of the purge gas may contaminate the substrate on the stage.

SUMMARY

Some example embodiments provide apparatuses for processing a substrate that may be capable of forming a purge passage having a uniform width and facilitating a flow of a purge gas toward an outskirt of a stage.

According to an example embodiment, there may be provided an apparatus for processing a substrate. The apparatus for processing the substrate may include a reaction chamber, a stage, a showerhead, a first outer ring and a second outer ring. The stage may be arranged in the reaction chamber and configured to support the substrate. The showerhead may be arranged in the reaction chamber and configured to provide the substrate with a reaction gas. The first outer ring may be configured to surround an edge portion of an upper surface of the stage. The first outer ring may include at least one alignment groove. The second outer ring may be configured to surround the first outer ring. The second outer ring may include at least one alignment pin configured to be inserted into the alignment groove.

According to an example embodiment, there may be provided an apparatus for processing a substrate. The apparatus for processing the substrate may include a reaction chamber, a stage, a showerhead, a first outer ring and a second outer ring. The stage may be arranged in the reaction chamber and configured to support the substrate. The showerhead may be arranged in the reaction chamber and configured to provide the substrate with a reaction gas. The first outer ring may be configured to surround an edge portion of an upper surface of the stage. The first outer ring may include a plurality of alignment grooves. The second outer ring may be configured to surround the first outer ring. The second outer ring may include a plurality of receiving grooves and a plurality of alignment pins, the alignment pins corresponding to the receiving grooves, respectively, and configured to be inserted into the alignment grooves, respectively. A first auxiliary purge passage may be provided at a side of each of the alignment grooves and configured to induce a purge gas provided to the upper surface of the stage toward an outskirt of the stage. A second auxiliary purge passage may be provided under each of the alignment grooves and configured to induce the purge gas toward the outskirt of the stage.

According to an example embodiment, there may be provided an apparatus for processing a substrate. The apparatus for processing the substrate may include a reaction chamber, a stage, a showerhead, a first outer ring and a second outer ring. The stage may be arranged in the reaction chamber and configured to support the substrate. The showerhead may be arranged in the reaction chamber and configured to provide the substrate with a reaction gas. The first outer ring may be configured to surround an edge portion of an upper surface of the stage. The first outer ring may include a plurality of alignment protrusions, which include a plurality of alignment grooves, respectively. The second outer ring may be configured to surround the first outer ring. The second outer ring may include a plurality of receiving grooves configured to receive the alignment protrusions and a plurality of alignment pins, the alignment pins arranged on bottom surfaces of the receiving grooves, respectively. The alignment pins may be configured to be inserted into the alignment grooves, respectively. The first outer ring and the second outer ring may define a main purge passage therebetween, the main purge passage being configured to induce a purge gas provided to the upper surface of the stage toward an outskirt of the stage. A side surface of each of the alignment protrusions and an inner side surface of a corresponding one of the receiving grooves define a first auxiliary purge passage therebetween, the first auxiliary purge passage being configured to induce the purge gas toward the outskirt of the stage. A lower surface of each of the alignment protrusions and the bottom surface of each of the receiving grooves define a second auxiliary purge passage between, the second auxiliary purge passage being configured to induce the purge gas toward the outskirt of the stage.

According to some example embodiments, the alignment pin of the second outer ring may be inserted into the alignment groove of the first outer ring to locate the second outer ring at an accurate position. Thus, the main purge passage between the first outer ring and the second outer ring may have a uniform width and exhaust efficiency of the reaction gas may be improved. Particularly, the first auxiliary purge passage and the second auxiliary purge passage may be provided between the alignment protrusion and the receiving groove, and the exhaust efficiency of the reaction gas may be further improved.

BRIEF DESCRIPTION OF THE DRAWINGS

Example embodiments will be more clearly understood from the following detailed description taken in conjunction with the accompanying drawings.

FIG. 1 is a cross-sectional view illustrating an apparatus for processing a substrate in accordance with an example embodiment;

FIG. 2 is a perspective view illustrating a first outer ring of the apparatus in FIG. 1;

FIG. 3 is a cross-sectional view taken along a line A-A' in FIG. 2;

FIG. 4 is an enlarged perspective view of a portion "B" in FIG. 2;

FIG. 5 is a perspective view illustrating a second outer ring of the apparatus in FIG. 1;

FIG. 6 is a cross-sectional view taken along a line C-C' in FIG. 5;

FIG. 7 is an enlarged perspective view of a portion "D" in FIG. 5;

FIG. 8 is a perspective view illustrating an alignment pin inserted into a receiving groove in FIG. 5;

FIG. 9 is a perspective view illustrating a structure in which the first outer ring in FIG. 2 and the second outer ring in FIG. 5 are coupled;

FIG. 10 is a cross-sectional view taken along a line E-E' in FIG. 9;

FIG. 11 is an enlarged perspective view of a portion "F" in FIG. 9;

FIG. 12 is a cross-sectional view taken along a line G-G' in FIG. 11;

FIG. 13 is a perspective view illustrating a structure in which a first outer ring and a second outer ring are coupled, in accordance with an example embodiment;

FIG. 14 is a perspective view illustrating a structure in which a first outer ring and a second outer ring are coupled, in accordance with an example embodiment; and FIG. 15 is a perspective view illustrating a structure in which a first outer ring and a second outer ring are coupled, in accordance with an example embodiment.

DETAILED DESCRIPTION

Hereinafter, some example embodiments will be explained in detail with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

Figure 1:
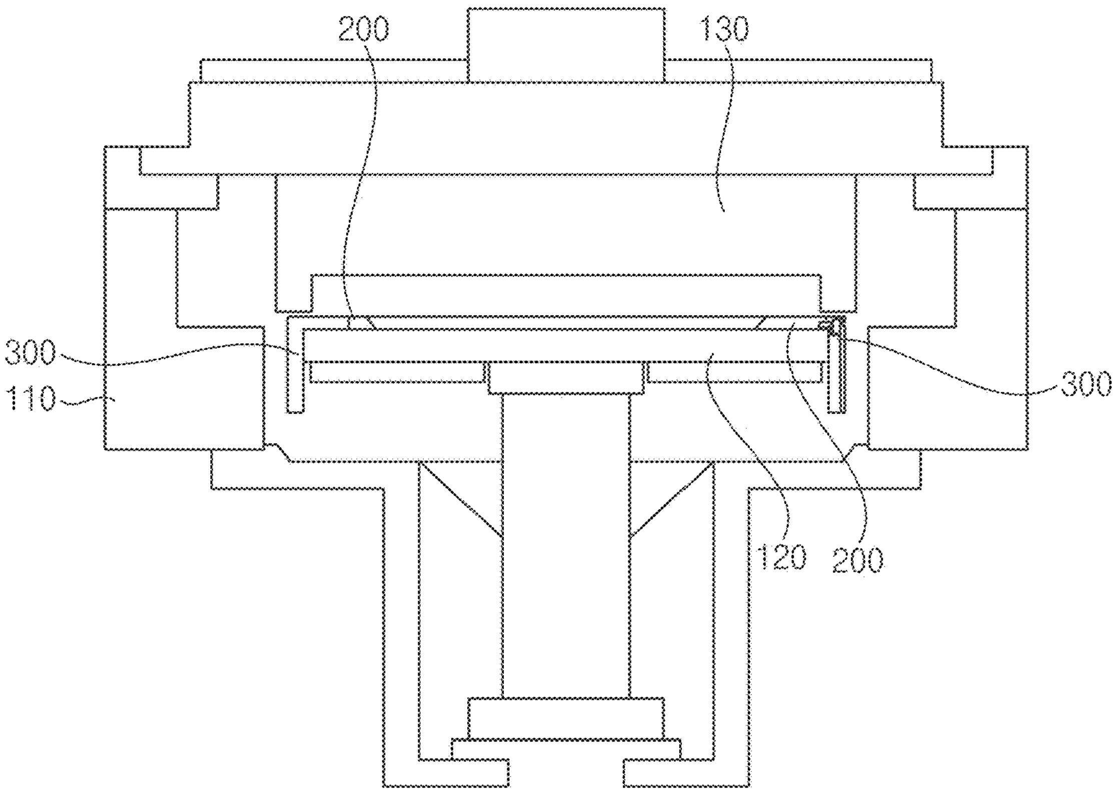
FIGS. 1 to 15 represent non-limiting, example embodiments as described herein.

FIG. 1 is a cross-sectional view illustrating an apparatus for processing a substrate in accordance with an example embodiment.

Referring to FIG. 1, an apparatus for processing a substrate may include a reaction chamber 110, a stage 120, a showerhead 130, a first outer ring 200 and a second outer ring 300. The apparatus may include an atomic layer deposition (ALD) apparatus, not limited thereto. For example, the apparatus may include a deposition apparatus having a type different from the ALD apparatus, an etching apparatus, an ashing apparatus, etc. The apparatus may include apparatuses including the first outer ring 200 and the second outer ring 300.

The reaction chamber 110 may have an inner space configured to receive the substrate. When the apparatus may include the ALD apparatus, the reaction chamber 110 may perform an ALD process with respect to the substrate.

The stage 120 may be arranged at a lower region in the inner space of the reaction chamber 110. The substrate may be placed on an upper surface of the stage 120. A heater for heating the substrate may be arranged in the stage 120.

The showerhead 130 may be arranged at an upper region in the inner space of the reaction chamber 110. The showerhead 130 may supply a reaction gas into the reaction chamber 110.

A purge gas may be provided to the stage 120 from down to up to discharge particles (e.g., byproducts of the ALD process) from the reaction chamber 110. The first outer ring 200 and the second outer ring 300 may aid the exhaust of the reaction gas injected from the showerhead 130. Further, the second outer ring 300 may mitigate or prevent a layer from being deposited on a lower surface of the stage 120.

The first outer ring 200 may be arranged at an edge portion of the upper surface of the stage 120. The first outer ring 200 may have a diameter shorter than a diameter of the stage 120. The second outer ring 300 may be arranged at the edge portion of the upper surface of the stage 120 to surround the first outer ring 200. Further, the second outer ring 300 may be configured to surround side surfaces of the stage 120. The second outer ring 300 may have a diameter longer than the diameter of the stage 120.

A main purge passage 400 (see FIG. 10) may be formed between an inner circumferential surface of the second outer ring 300 and the side surface of the stage 120. The purge gas may flow through the main purge passage 400. Further, the main purge passage 400 may also be formed between the first outer ring 200 and the second outer ring 300. That is, the purge gas may flow through between the second outer ring 300 and the stage 120 and between the first outer ring 200 and the second outer ring 300. The purge gas may then be injected toward a region over the stage 120.

Figure 2:
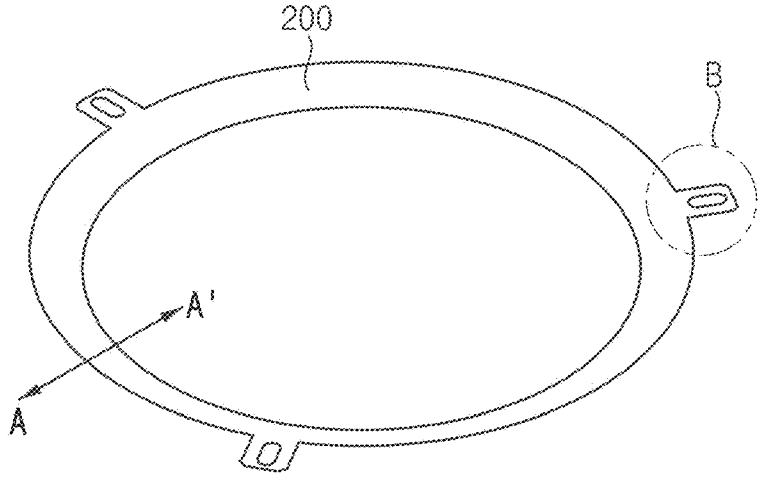
Figure 3:
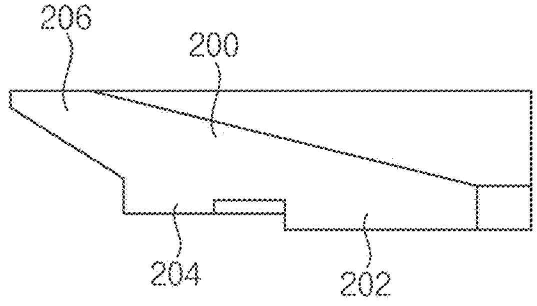
Figure 4:
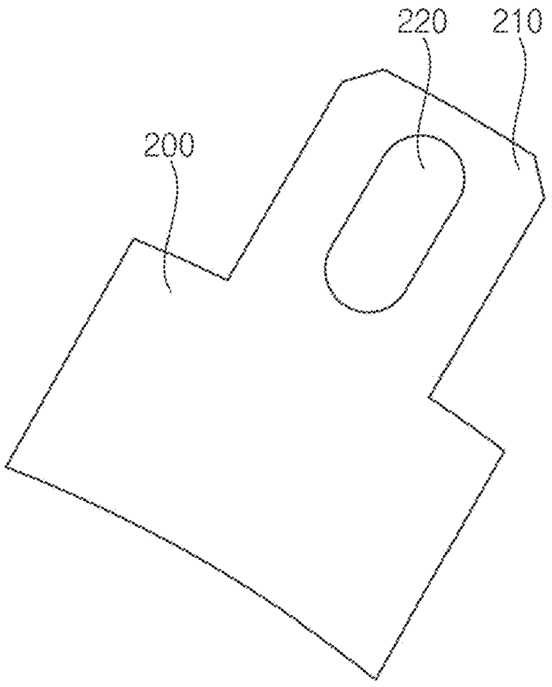

FIG. 2 is a perspective view illustrating a first outer ring of the apparatus in FIG. 1, FIG. 3 is a cross-sectional view taken along a line A-A' in FIG. 2, and FIG. 4 is an enlarged perspective view of a portion "B" in FIG. 2.

Referring to FIGS. 2 to 4, the first outer ring 200 may include a first vertical protrusion 202, a second vertical protrusion 204 and a horizontal protrusion 206.

The first vertical protrusion 202 may be extended from an inner portion of a lower surface of the first outer ring 200 in a downward direction. The first vertical protrusion 202 may be configured to make contact with the upper surface of the stage 120.

The second vertical protrusion 204 may be extended from an outer portion of the lower surface of the first outer ring 200 in the downward direction. Thus, the second vertical protrusion 204 may be configured to surround the first vertical protrusion 202. The second vertical protrusion 204 may be configured to make contact (or to not make contact) with the upper surface of the stage 120.

The horizontal protrusion 206 may be horizontally extended from an outer circumferential surface of the first outer ring 200. The horizontal protrusion 206 may include a slant lower surface with respect to an upper surface of the first outer ring 200. The slant lower surface of the horizontal protrusion 206 may be configured to define an upper inner surface of the main purge passage 400.

The first outer ring 200 may include three alignment protrusions 210. The alignment protrusions 210 may be protruded from the outer circumferential surface of the first outer ring 200 in a radial direction of the first outer ring 200. Thus, the alignment protrusions 210 may be positioned over the second outer ring 300. The three alignment protrusions 210 may be spaced apart from each other by a uniform gap, for example, about 120°, not limited thereto. Further, each of the alignment protrusions 210 may have a rectangular shape, not limited thereto.

The first outer ring 200 may include three alignment grooves 220. Each of the alignment grooves 210 may be vertically formed through a corresponding one of the alignment protrusions 210. Because the alignment protrusions 210 may be positioned over the second outer ring 300, the alignment grooves 220 may also be positioned over the second outer ring 300. In some example embodiments, each of the alignment grooves 220 may have an elliptical shape having a long axis in the radial direction of the first outer ring 200, not limited thereto.

Figure 5:
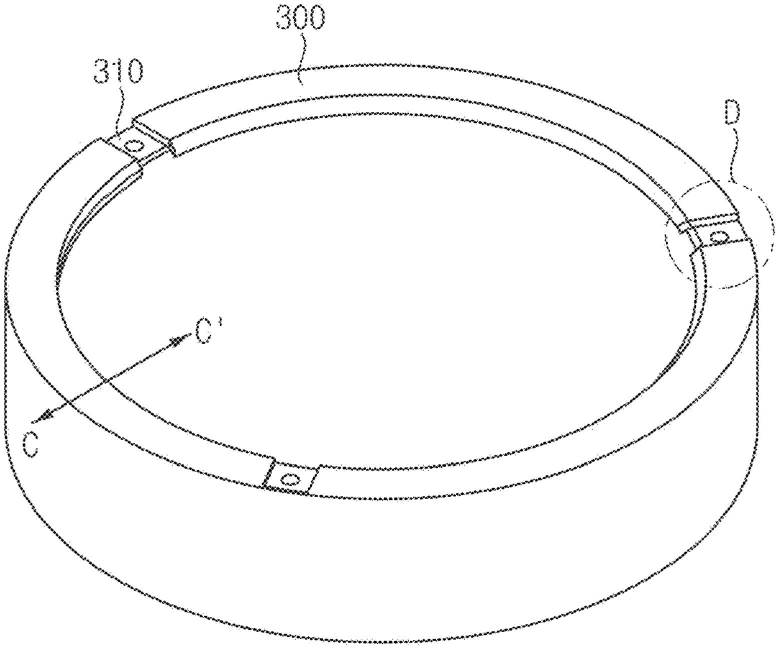
Figure 6:
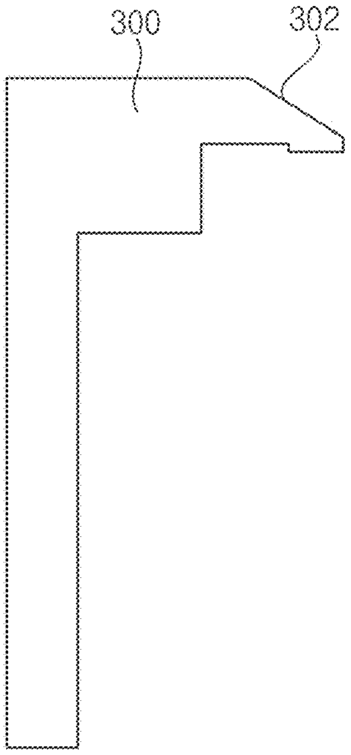
Figure 7:
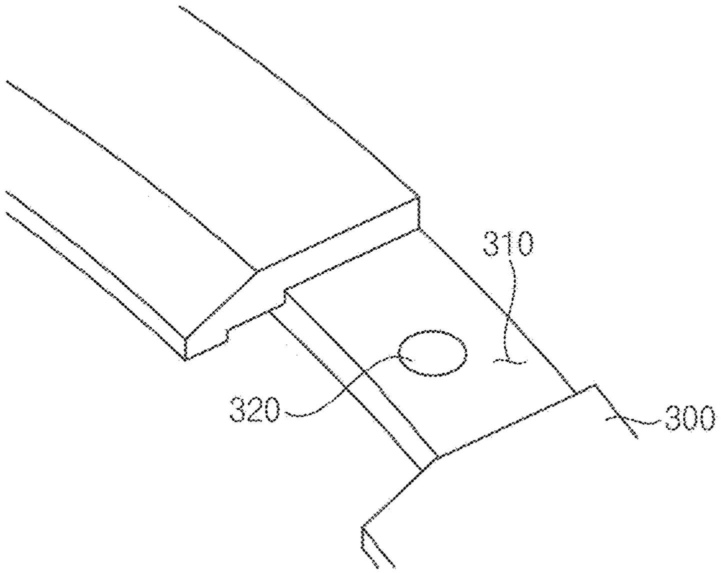
Figure 8:
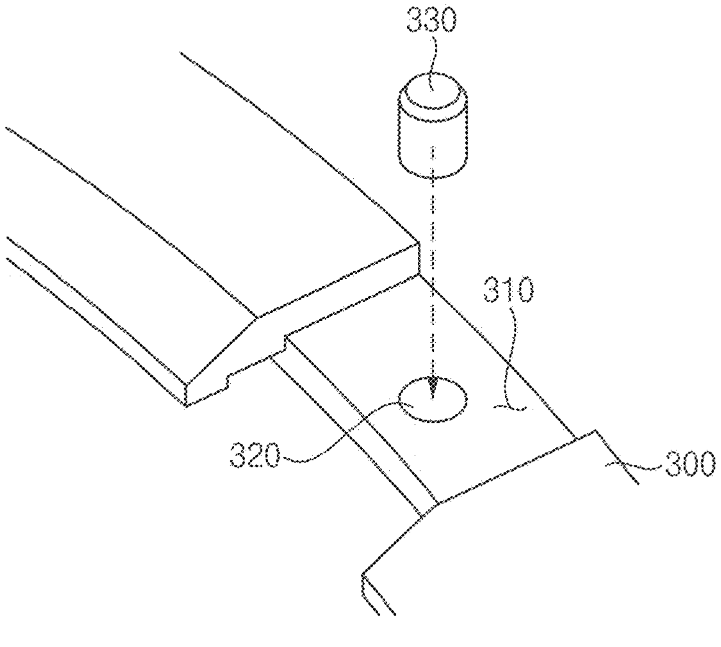

FIG. 5 is a perspective view illustrating a second outer ring of the apparatus in FIG. 1, FIG. 6 is a cross-sectional view taken along a line C-C' in FIG. 5, FIG. 7 is an enlarged perspective view of a portion "D" in FIG. 5, and FIG. 8 is a perspective view illustrating an alignment pin inserted into a receiving groove in FIG. 5.

Referring to FIGS. 5 to 8, the second outer ring 300 may include a slant outer circumferential surface 302. The slant outer circumferential surface 302 of the second outer ring 300 may be spaced apart from the slant lower surface of the horizontal protrusion 206 in the first outer ring 200 to form the main purge passage 400 between the first outer ring 200 and the second outer ring 300. Thus, because the main purge passage 400 may be defined by the slant inner circumferential surface 302 of the second outer ring 300 and the slant lower surface of the horizontal protrusion 206 in the first outer ring 200, the main purge passage 400 may be extended along a direction oriented toward the outskirt of the stage 120. Thus, the purge gas may flow toward the outskirt of the stage 120.

The second outer ring 300 may include three receiving grooves 310. The alignment protrusions 210 of the first outer ring 200 may be received in the receiving grooves 310 of the second outer ring 300, respectively. Thus, each of the receiving grooves 310 may have a size larger than a size of a corresponding one of the alignment protrusions 210. Thus, a first auxiliary purge passage 410 may be formed between at least one of both side surfaces of the alignment protrusions 210 and at least one of both inner side surfaces of the receiving grooves 310. In some example embodiments, the first auxiliary purge passage 410 may include a pair of passages between both side surfaces of the alignment protrusion 210 and both side inner surfaces of the receiving groove 310.

The purge gas flowing through the main purge passage 400 may be induced toward the outskirt of the stage 120 through the first auxiliary purge passage 410. Thus, the particles in the purge gas may also be induced toward the outskirt of the stage 120 to suppress the substrate on the stage 120 from being contaminated.

Each of pin holes 320 may be formed in a bottom surface of each of the receiving grooves 310. Alignment pins 330 may be inserted into the pin holes 320, respectively. The alignment pins 330 may be inserted into the alignment grooves 220 of the first outer ring 200. The alignment groove 220 may have a size larger than a size of the alignment pin 330 so that the alignment pin 330 may be slightly moved in the alignment groove 220. Thus, during aligning the first outer ring 200 with the second outer ring 300, a position of the first outer ring 200 may be precisely controlled.

Therefore, the alignment pins 300 of the second outer ring 300 may be inserted into the alignment grooves 220 of the first outer ring 200 to fix the first outer ring 200 to the second outer ring 300.

Figure 9:
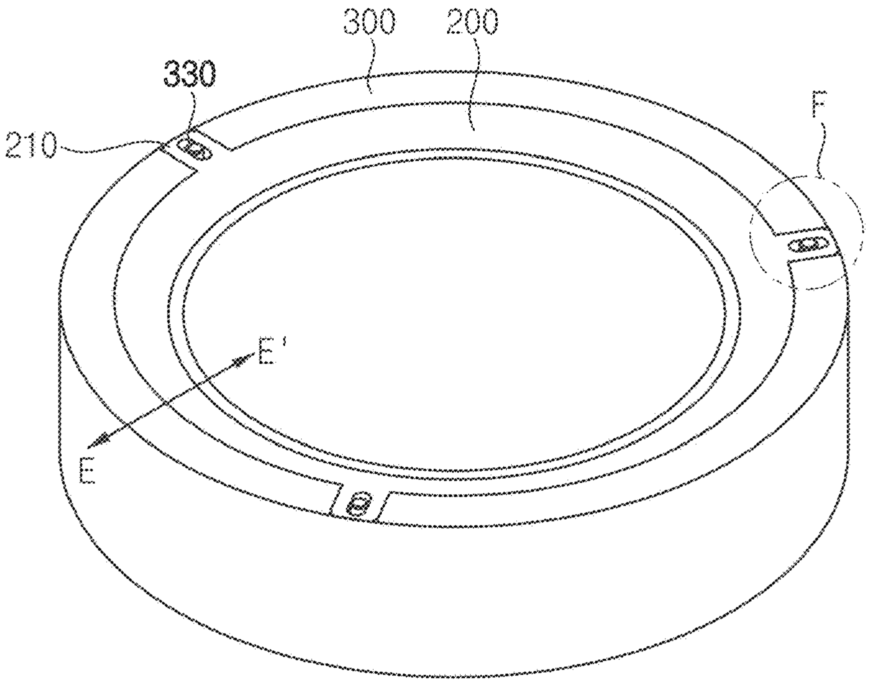
Figure 10:
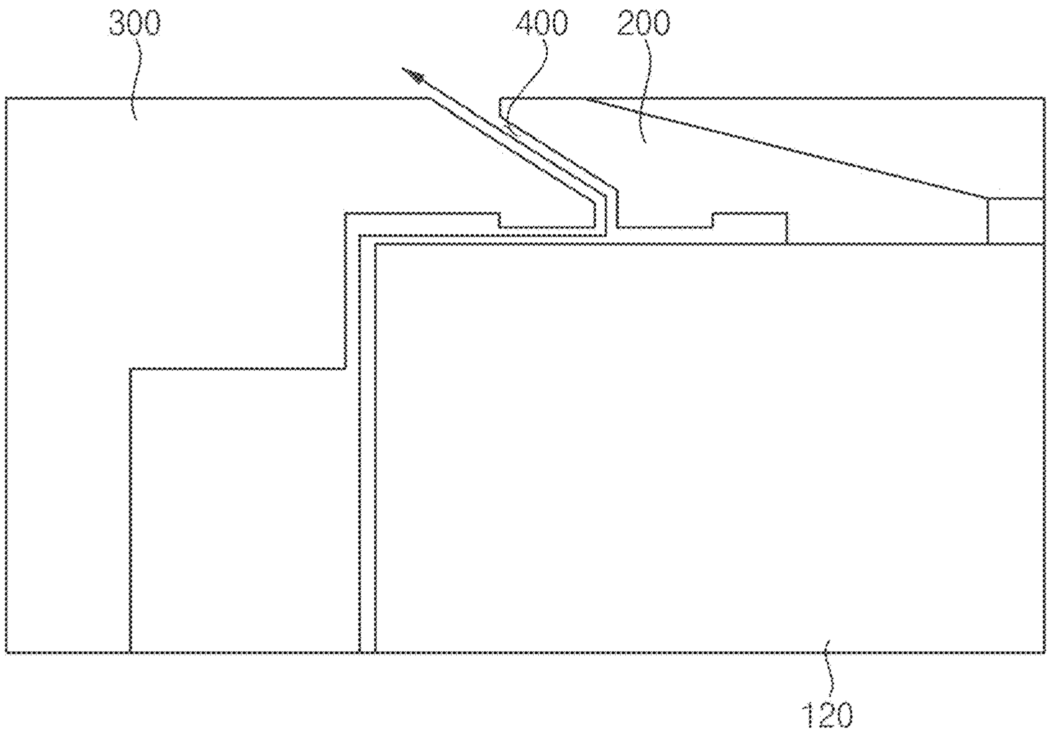
Figure 11:
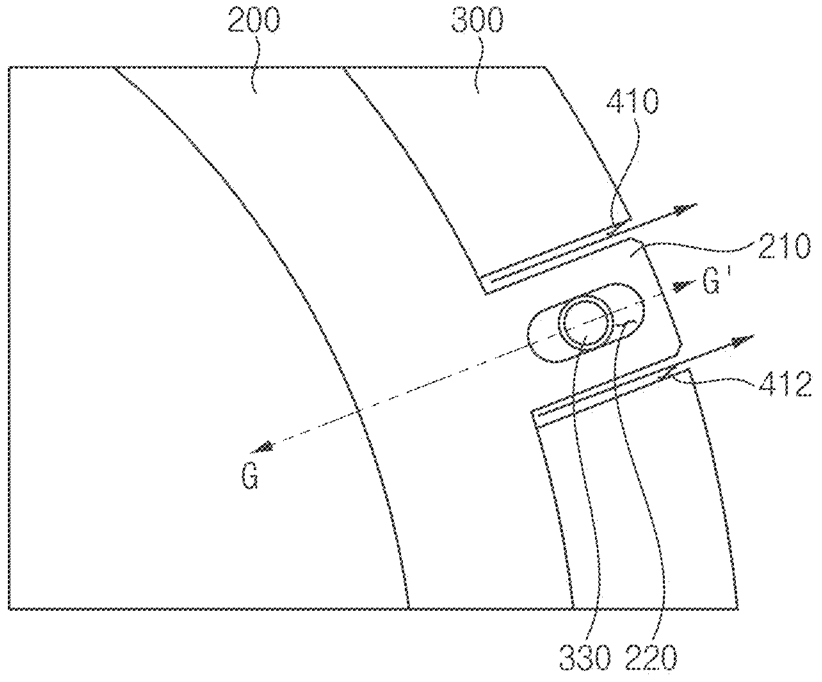
Figure 12:
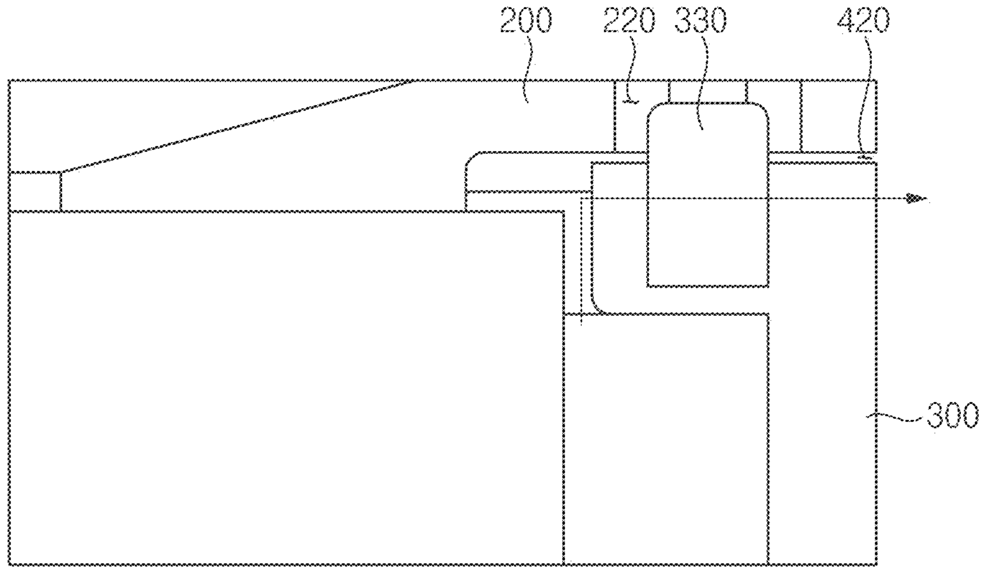

FIG. 9 is a perspective view illustrating a structure in which the first outer ring in FIG. 2 and the second outer ring in FIG. 5 are coupled, FIG. 10 is a cross-sectional view taken along a line E-E' in FIG. 9, FIG. 11 is an enlarged perspective view of a portion "F" in FIG. 9, and FIG. 12 is a cross-sectional view taken along a line G-G' in FIG. 11.

Referring to FIGS. 9 to 12, when the first outer ring 200 may be positioned over the second outer ring 300, the alignment pins 330 may be inserted into the alignment grooves 220. Thus, the first outer ring 200 may be fixed to the second outer ring 300. That is, a relative position of the first outer ring 200 with respect to the second outer ring 300 may be fixed to mitigate or prevent the first outer ring 200 from being biased. Thus, the gap between the first outer ring 200 and the second outer ring 300 (e.g., the main purge passage 400) may have a uniform width. Therefore, the purge gas having a uniform amount may flow through the main purge passage 400, and thus the exhaust efficiency of the reaction gas may be improved.

Further, the alignment protrusion 210 may be spaced apart from the receiving groove 310. For example, the side surface of the alignment protrusion 210 may be spaced apart from the inner side surface of the receiving groove 310 to form the first auxiliary purge passage 410. The lower surface of the alignment protrusion 210 may be spaced apart from the bottom surface of the receiving groove 310 to form the second auxiliary purge passage 420.

Therefore, the purge gas may flow through the first auxiliary purge passage 410 and the second auxiliary passage 420 as well as the main purge passage 400, and thus the exhaust efficiency of the reaction gas may be further improved. Thus, the particles may be effectively removed to suppress the substrate from being contaminated by the particles.

Figure 13:
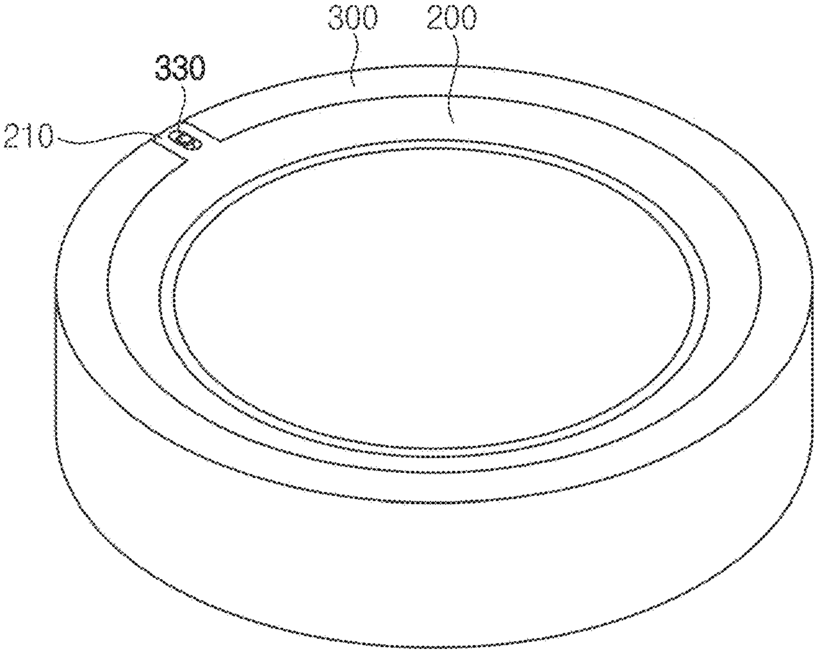

FIG. 13 is a perspective view illustrating a structure in which a first outer ring and a second outer ring are coupled in accordance with an example embodiment.

Referring to FIG. 13, the first outer ring 200 may include the single alignment protrusion 210 with a single alignment groove 220. Thus, the second outer ring 300 may include a single alignment pin 330.

Figure 14:
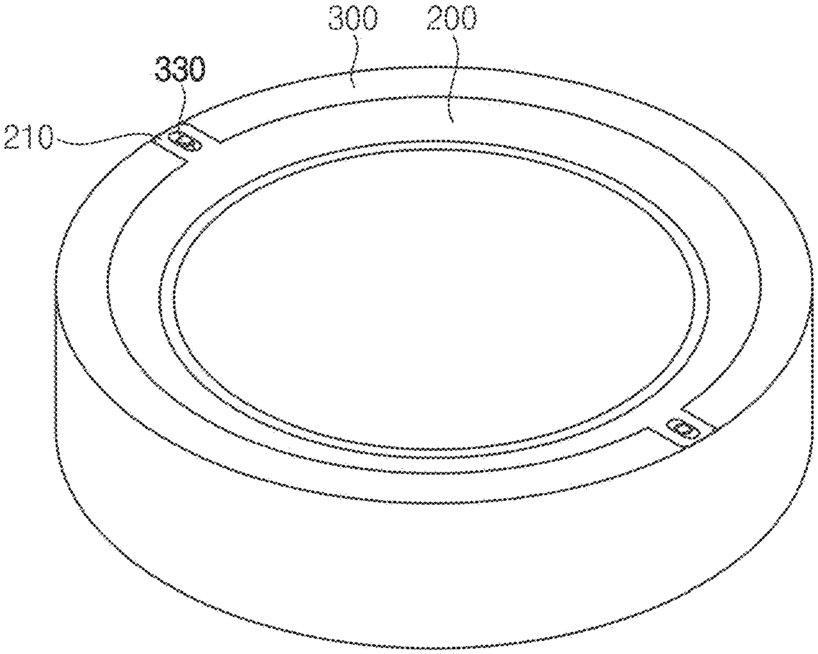

FIG. 14 is a perspective view illustrating a structure in which a first outer ring and a second outer ring are coupled, in accordance with an example embodiment.

Referring to FIG. 14, the first outer ring 200 may include the two alignment protrusions 210 each including an alignment groove 220. The alignment protrusions 210 may be spaced apart from each other by a uniform gap, for example, about 180°. Thus, the second outer ring 300 may include two alignment pins 330.

Figure 15:
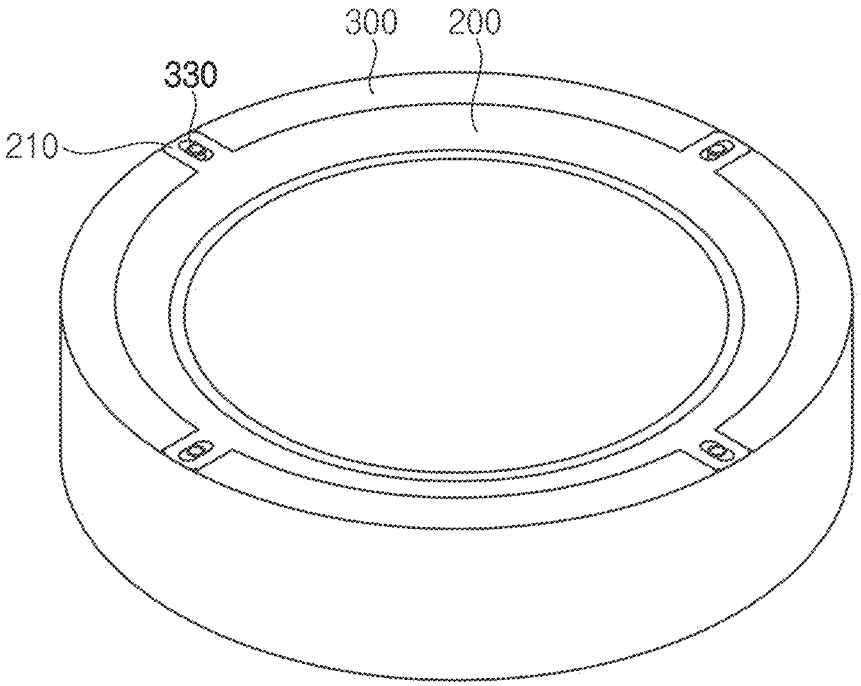

FIG. 15 is a perspective view illustrating a structure in which a first outer ring and a second outer ring are coupled, in accordance with an example embodiment.

Referring to FIG. 15, the first outer ring 200 may include the four alignment protrusions 210 each including an alignment groove 220. The alignment protrusions 210 may be spaced apart from each other by a uniform gap, for example, about 90°. Thus, the second outer ring 300 may include four alignment pins 330.

In some example embodiments, the alignment pin 330 may be provided to the second outer ring 300 and the alignment groove 220 may be provided to the first outer ring 200. However, example embodiments are not limited thereto. In some example embodiments, the alignment pin 330 may be provided to the first outer ring 200 and the alignment groove 220 may be provided to the second outer ring 300.

According to some example embodiments, the alignment pin of the second outer ring may be inserted into the alignment groove of the first outer ring to locate the second outer ring at an accurate position. Thus, the main purge passage between the first outer ring and the second outer ring may have a uniform width to improve exhaust efficiency of the reaction gas. The first auxiliary purge passage and the second auxiliary purge passage may be formed between the alignment protrusion and the receiving groove to further improve the exhaust efficiency of the reaction gas.

The foregoing is illustrative of example embodiments and is not to be construed as limiting thereof. Although some example embodiments have been described, those skilled in the art will readily appreciate that many modifications are possible in the disclosed example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An apparatus for processing a substrate, the apparatus comprising:
- a reaction chamber;
- a stage arranged in the reaction chamber and configured to support the substrate;
- a showerhead arranged in the reaction chamber and configured to provide the substrate with a reaction gas;
- a first outer ring arranged at an edge portion of an upper surface of the stage, the first outer ring including at least one alignment groove; and
- a second outer ring configured to surround the first outer ring, the second outer ring including at least one alignment pin configured to be inserted into the alignment groove,
- wherein the first outer ring and the second outer ring define a main purge passage therebetween, the main purge passage being configured to induce a purge gas provided to the upper surface of the stage toward an outskirt of the stage.

2. The apparatus of claim 1, wherein the first outer ring further comprises at least one alignment protrusion protruded from an outer circumferential surface of the first outer ring, and the alignment protrusion includes the alignment groove.

3. The apparatus of claim 2, wherein the second outer ring further comprises a receiving groove configured to receive the alignment protrusion.

4. The apparatus of claim 3, wherein the alignment pin is installed at a bottom surface of the receiving groove.

5. The apparatus of claim 3, wherein a side surface of the alignment protrusion and an inner side surface of the receiving groove define a first auxiliary purge passage, which is configured to induce a purge gas provided to the upper surface of the stage toward an outskirt of the stage.

6. The apparatus of claim 3, wherein a lower surface of the alignment protrusion and a bottom surface of the receiving groove define a second auxiliary purge passage, which is configured to induce a purge gas provided to the upper surface of the stage toward an outskirt of the stage.

7. The apparatus of claim 1, wherein the alignment groove comprises a plurality of grooves spaced apart from each other by a uniform gap.

8. The apparatus of claim 7, wherein the alignment grooves comprise three grooves spaced apart from each other by about 120°.

9. The apparatus of claim 1, wherein the alignment groove has an elliptical shape having a long axis corresponding to a radial direction of the first outer ring.

10. The apparatus of claim 1, wherein the reaction chamber comprises a chamber configured to perform an atomic layer deposition (ALD) process.

11. An apparatus for processing a substrate, the apparatus comprising:
- a reaction chamber;
- a stage arranged in the reaction chamber and configured to support the substrate;
- a showerhead arranged in the reaction chamber and configured to provide the substrate with a reaction gas;
- a first outer ring arranged at an edge portion of an upper surface of the stage, the first outer ring including a plurality of alignment grooves; and
- a second outer ring configured to surround the first outer ring, the second outer ring including a plurality of receiving grooves and a plurality of alignment pins, the alignment pins corresponding to the receiving grooves, respectively, and configured to be inserted into the alignment grooves, respectively,
- wherein a first auxiliary purge passage is provided at a side of each of the receiving grooves and configured to induce a purge gas provided to the upper surface of the stage toward an outskirt of the stage, and a second auxiliary purge passage is provided under each of the receiving grooves and configured to induce the purge gas toward the outskirt of the stage.

12. The apparatus of claim 11, wherein the first outer ring further comprises a plurality of alignment protrusions protruded from an outer circumferential surface of the first outer ring, and the alignment protrusions include the alignment grooves, respectively.

13. The apparatus of claim 12, wherein the receiving grooves is configured to receive the alignment protrusions, respectively, a side surface of each of the alignment protrusions and an inner side surface of a corresponding one of the receiving grooves define the first auxiliary purge passage, and a lower surface of each of the alignment protrusions and a bottom surface of a corresponding one of the receiving grooves define the second auxiliary purge passage.

14. The apparatus of claim 13, wherein each of alignment pins is installed at the bottom surface of the receiving groove.

15. The apparatus of claim 11, wherein the alignment grooves comprise three grooves spaced apart from each other by a uniform gap.

16. The apparatus of claim 11, wherein each of the alignment grooves has an elliptical shape having a long axis corresponding to a radial direction of the first outer ring.

17. The apparatus of claim 11, wherein the reaction chamber comprises a chamber configured to perform an atomic layer deposition (ALD) process.

18. An apparatus for processing a substrate, the apparatus comprising:

a reaction chamber;

a stage arranged in the reaction chamber and configured to support the substrate;

a showerhead arranged in the reaction chamber and configured to provide the substrate with a reaction gas;

a first outer ring configured to surround an edge portion of an upper surface of the stage, the first outer ring including a plurality of alignment protrusions, which include a plurality of alignment grooves, respectively; and a second outer ring arranged at the first outer ring, the second outer ring including a plurality of receiving grooves configured to receive the alignment protrusions and a plurality of alignment pins, the alignment pins arranged on bottom surfaces of the receiving grooves, respectively, and configured to be inserted into the alignment grooves, respectively, wherein the first outer ring and the second outer ring define a main purge passage therebetween, the main purge passage being configured to induce a purge gas provided to the upper surface of the stage toward an outskirt of the stage, a side surface of each of the alignment protrusions and an inner side surface of a corresponding one of the receiving grooves define a first auxiliary purge passage therebetween, the first auxiliary purge passage being configured to induce the purge gas toward the outskirt of the stage, and a lower surface of each of the alignment protrusions and a bottom surface of each of the receiving grooves define a second auxiliary purge passage between, the second auxiliary purge passage being configured to induce the purge gas toward the outskirt of the stage.

19. The apparatus of claim 18, wherein the alignment grooves comprise three grooves spaced apart from each other by a uniform gap.

20. The apparatus of claim 18, wherein each of the alignment grooves has an elliptical shape having a long axis corresponding to a radial direction of the first outer ring.

* * * * *